(12) United States Patent
Liu

(10) Patent No.: US 8,479,804 B2
(45) Date of Patent: Jul. 9, 2013

(54) HEAT DISSIPATION DEVICE WITH TWO SPRING FASTNERS

(75) Inventor: Jian Liu, Shenzhen (CN)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 444 days.

(21) Appl. No.: 12/902,169

(22) Filed: Oct. 12, 2010

(65) Prior Publication Data

US 2011/0146954 A1 Jun. 23, 2011

(30) Foreign Application Priority Data

Dec. 21, 2009 (CN) .......................... 2009 1 0311940

(51) Int. Cl.
*F28D 15/00* (2006.01)
*F28F 7/00* (2006.01)
*F28F 9/00* (2006.01)
*H01L 23/467* (2006.01)

(52) U.S. Cl.
USPC ................ 165/80.2; 165/104.26; 165/104.33; 165/67; 165/121; 165/80.4; 411/999; 411/544; 361/695; 361/697; 361/699; 361/700; 361/679.47

(58) Field of Classification Search
USPC .............. 165/80.2, 80.3, 104.26, 104.33, 67, 165/121; 411/999, 544; 361/695, 697, 699, 361/700, 679.47, 679.52
See application file for complete search history.

(56) References Cited

U.S. PATENT DOCUMENTS

| | | | | |
|---|---|---|---|---|
| 2,922,211 A * | 1/1960 | Boyd | ............................ | 411/551 |
| 5,688,093 A * | 11/1997 | Bowers | ........................ | 411/552 |
| 6,545,879 B1 * | 4/2003 | Goodwin | ..................... | 361/807 |
| 7,057,897 B2 * | 6/2006 | Leu | ............................... | 361/704 |
| 7,116,556 B2 * | 10/2006 | Lee et al. | ..................... | 361/704 |
| 7,142,422 B2 * | 11/2006 | Lee et al. | ..................... | 361/695 |
| 7,254,023 B2 * | 8/2007 | Lu et al. | ....................... | 361/698 |
| 7,278,809 B2 * | 10/2007 | Aukzemas et al. | .......... | 411/432 |
| 7,333,340 B2 * | 2/2008 | Zhang et al. | .................. | 361/719 |
| 7,441,980 B2 * | 10/2008 | Leitermann et al. | ......... | 403/149 |
| 8,009,428 B1 * | 8/2011 | Ye | ................................ | 361/710 |
| 8,120,918 B2 * | 2/2012 | Liu | .............................. | 361/700 |
| 2007/0044945 A1 * | 3/2007 | Zhou et al. | .................... | 165/121 |
| 2009/0154110 A1 * | 6/2009 | Ma et al. | ...................... | 361/719 |

* cited by examiner

*Primary Examiner* — Brandon M Rosati
*Assistant Examiner* — Claire Rojohn, III
(74) *Attorney, Agent, or Firm* — Altis Law Group, Inc.

(57) ABSTRACT

An exemplary heat dissipation device includes a fan having fixing cylinders, a heat sink having a supporting board, and fasteners fixing the fan to the heat sink. Each fastener includes a screwing pole, a first elastic member and a second elastic member encircling the screwing pole, and a fastening cylinder engaging with the screwing pole. Each screwing pole includes a head, a shaft extending coaxially downwardly from the head, and a post extending coaxially downwardly from the shaft. For each fastener, the screwing pole extends through a corresponding fixing cylinder of the fan, the first elastic member is compressed between the head and the corresponding fixing cylinder, the second elastic member is compressed between the corresponding fixing cylinder and the fastening cylinder, and the post protrudes from the fastening cylinder and is engaged with the supporting board.

14 Claims, 6 Drawing Sheets

HEAT DISSIPATION DEVICE WITH TWO SPRING FASTNERS

BACKGROUND

1. Technical Field

The disclosure relates to heat dissipation devices, and, more particularly, to a heat dissipation device for dissipating heat generated by an electronic component.

2. Description of Related Art

It is well known that, during operation of a computer, electronic components such as central processing units (CPUs) frequently generate large amounts of heat. The heat must be quickly removed from the electronic component to prevent it from becoming unstable or being damaged. In many or most personal computers, a heat dissipation device is utilized to dissipate the heat from the electronic component.

A typical heat dissipation device includes a heat sink and a plurality of fasteners for keeping the heat sink in contact with the electronic component. The heat sink includes a base and a fin unit arranged on the base. The base includes a rectangular body, and four ears extending outwards from four corners of the body. Each of the fasteners includes a head, a shaft extending coaxially downwardly from the head, and a threaded post extending coaxially downwardly from the shaft. In the process of mounting each fastener on the heat sink, a spring is provided to encircle the shaft of the fastener. Then the fastener with the spring is extended into the ear of the base along a top to a bottom direction of the base, and the fastener is engaged with the ear of the base. When the heat sink is fixed to a printed circuit board where the electronic component is mounted, the threaded post of the fastener is extended beyond a bottom face of the base to engage with the printed circuit board, and the spring is compressed between the head and the ear of the base. Thereby a reacting force is exerted on the base by the compressed spring, to make the base contact the electronic component tightly.

However, the heat dissipation device usually further includes a fan mounted on the heat sink and a plurality of screws fixing the fan on the heat sink. This makes the operation of assembly of the heat dissipation device more complex, troublesome and costly.

What is needed, therefore, is a heat dissipation device which overcomes the above-mentioned limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
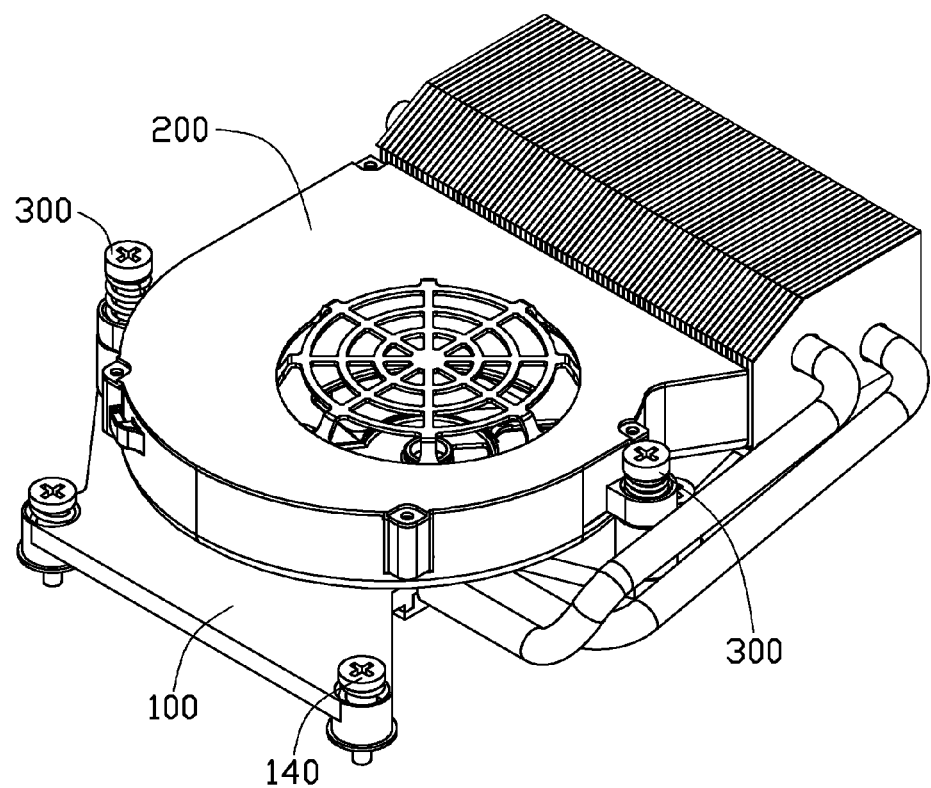
FIG. 1 is an isometric, assembled view of a heat dissipation device in accordance with an embodiment of the disclosure.

Referring to FIG. 1, a heat dissipation device in accordance with an embodiment of the disclosure is used for dissipating heat generated by an electronic component (not shown) mounted on a printed circuit board (not shown). The heat dissipation device comprises a heat sink 100, a fan 200, and a plurality of first fasteners 300 fixing the fan 200 to the heat sink 100. In the embodiment of the present disclosure, there are two first fasteners 300.

Figure 2:
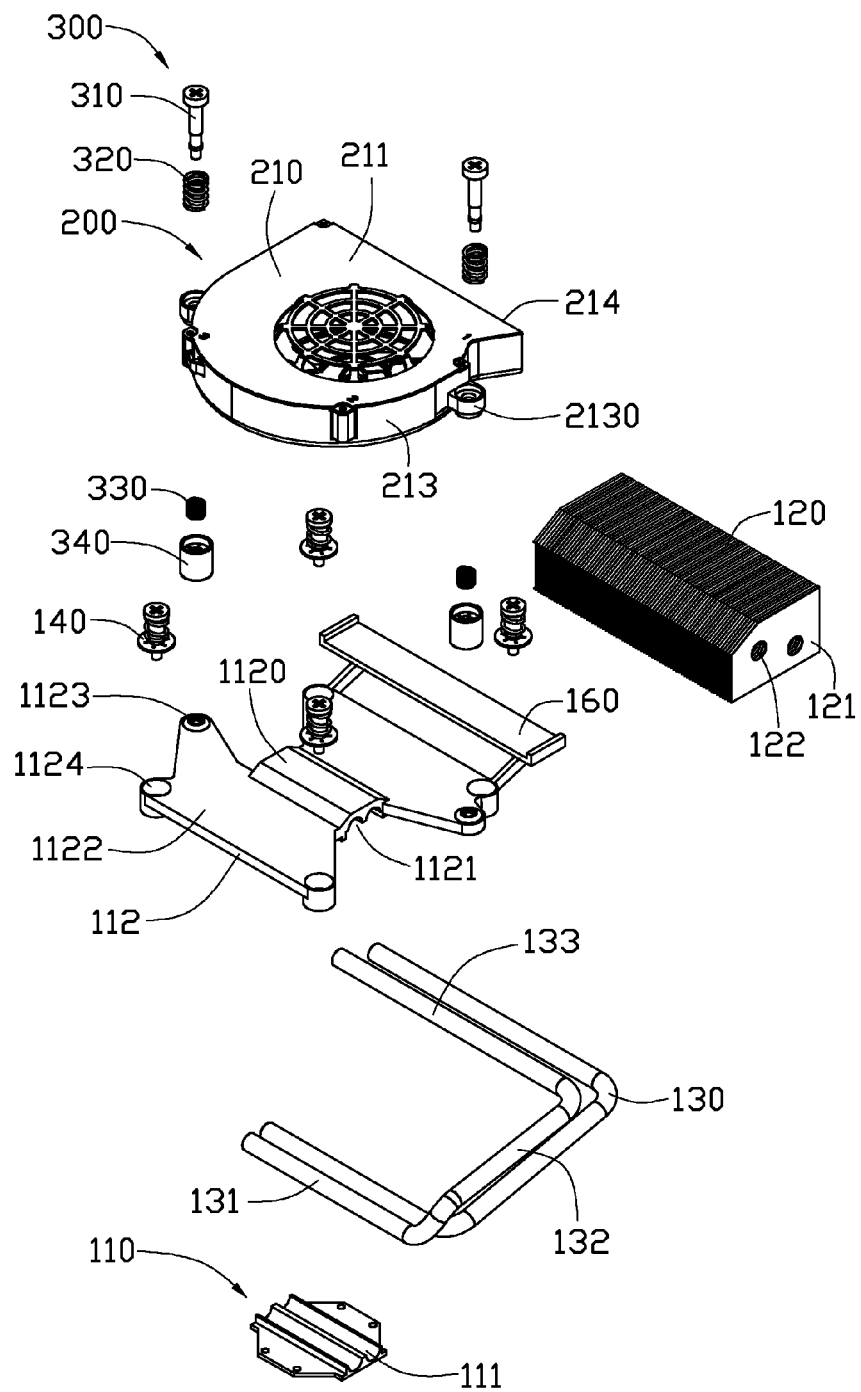
FIG. 2 is an exploded view of the heat dissipation device of FIG. 1.
Figure 3:
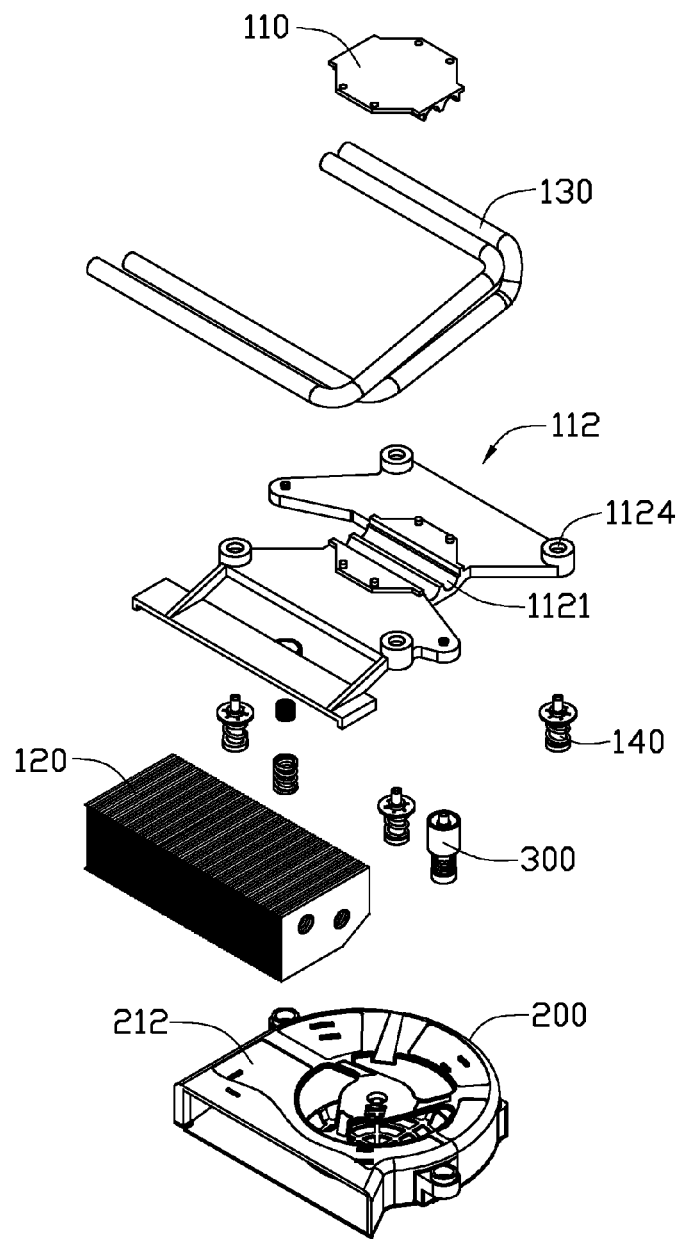
FIG. 3 is an exploded view of the heat dissipation device of FIG. 1, when the heat dissipation device is inverted.

Referring also to FIGS. 2 and 3, the heat sink 100 comprises a base 110, a supporting board 112 engaged with the base 110, a fin set 120 disposed on the supporting board 112, and a plurality of heat pipes 130 thermally connecting the base 110, the supporting board 112 and the fin set 120. In the embodiment of the present disclosure, there are two heat pipes 130. Each of the heat pipes 130 comprises an evaporation section 131, a condensation section 133, and a connecting section 132 interconnecting the evaporation section 131 and the condensation section 133.

The base 110 has a bottom face attached on the electronic component. Two parallel first grooves 111 are defined in a top face of the base 110. The evaporation sections 131 of the two heat pipes 130 are received in the two first grooves 111, respectively. The supporting board 112 comprises a substantially rectangular main body 1120, and two mounting plates 1122 extending outwardly from two lateral sides of the main body 121, respectively. Two parallel second grooves 1121 are defined in a bottom face of the main body 1120. The two second grooves 1121 are located corresponding to the two first grooves 111 of the base 110. The two first grooves 111 cooperate with the two second grooves 1121 to accommodate the evaporation sections 131 of the heat pipes 130, respectively. In other words, the evaporation sections 131 of the heat pipes 130 are sandwiched between the base 110 and the supporting board 112. Each of the mounting plates 1122 has an irregular polygon shape. The two mounting plates 1122 are symmetrical relative to the main body 1120. A first engaging hole 1123 is defined at a corner of each mounting plate 1122, and two second engaging holes 1124 are defined at another two corners of each mounting plate 1122. The two first fasteners 300 are extended through the fan 200, and screwed into the two first engaging holes 1123, thereby securing the fan 200 to the heat sink 100. The heat sink 100 further comprises four second fasteners 140. The four second fasteners 140 are extended through the four second engaging holes 1124 of the supporting board 112, respectively, and screwed into the printed circuit board, thereby securing the heat sink 100 to the printed circuit board.

The heat sink 100 further comprises a fin set holder 160 extending outwardly from a lateral side of the supporting board 112. The fin set 120 is secured to a right lateral side of the supporting board 112 via the fin set holder 160. The fin set holder 160 comprises a flat supporting portion (not labeled) supporting the fin set 120, and two arms (not labeled) interconnecting the supporting portion and the supporting board 112, respectively.

The fin set 120 comprises a plurality of fins 121. Each fin 121 comprises an upright sheet body (not labeled), and a pair of flanges (not labeled) bent horizontally from a top and a bottom of the sheet body and engaging with the sheet body of an adjacent fin 121. A passage (not labeled) is formed between every two adjacent fins 121, for allowing airflow through the fin set 120. Two spaced elongated receiving holes 122 are defined in the fin set 120, for accommodating the condensation sections 133 of the heat pipes 130. Each of the receiving holes 122 extend transversely (perpendicularly) through the fin set 120.

The fan 200 comprises a housing 210 disposed on the supporting board 112, and an impeller (not labeled) rotatably disposed in the housing 210. The housing 210 comprises a top plate 211, a bottom plate 212 located opposite to the top plate 211, and a volute sidewall 213 extending upwardly from an outer periphery of the bottom plate 212 and fixed to the top plate 211. Each of the top plate 211 and the bottom plate 212 defines a plurality of through holes at a center thereof, and each plurality of through holes functions as an air inlet for the fan 200. The top plate 211, the bottom plate 212, and the sidewall 213 cooperatively define a receiving space for receiving the impeller therein. The sidewall 213 defines a rectangular air outlet 214 at a right lateral side of the housing 210. The fin set 120 is located adjacent to the air outlet 214 of the housing 210, and the passages of the fin set 120 directly communicate with the air outlet 214. The fan 200 further comprises two spaced fixing cylinders 2130 extending outwardly from the sidewall 213 of the housing 210. An annular baffle wall 2132 protrudes inwardly from an inner circumference of each fixing cylinder 2130. In assembly, each of the first fasteners 300 is extended through a corresponding fixing cylinder 2130, and screwed into a corresponding first engaging hole 1123 of the supporting board 112.

Figure 4:
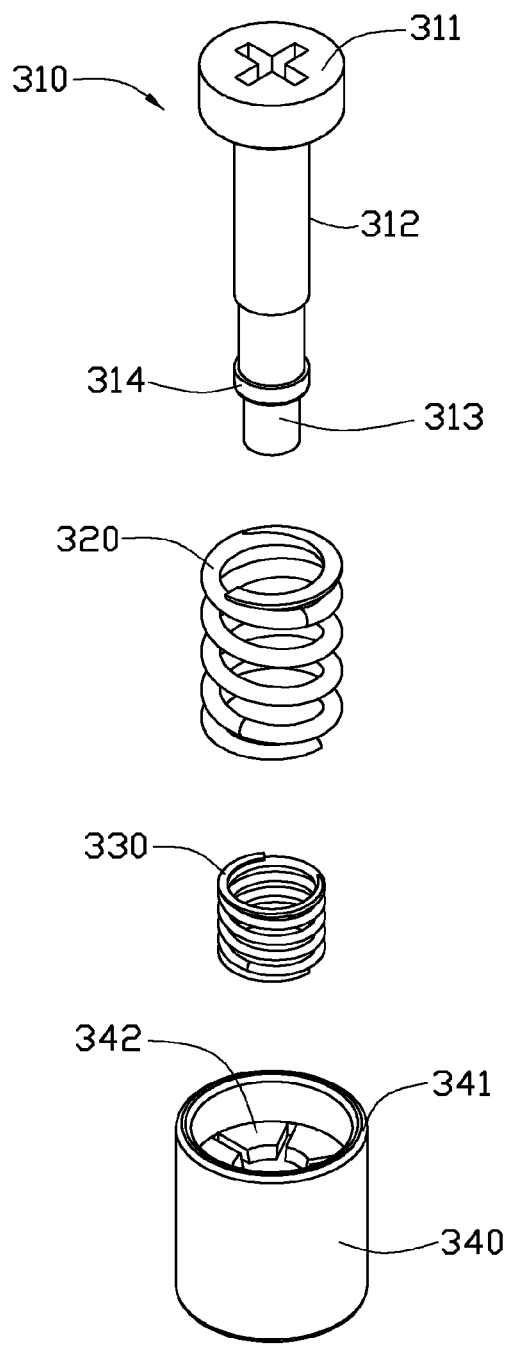
FIG. 4 is an enlarged, exploded view of a first fastener of the heat dissipation device of FIG. 1.
Figure 5:
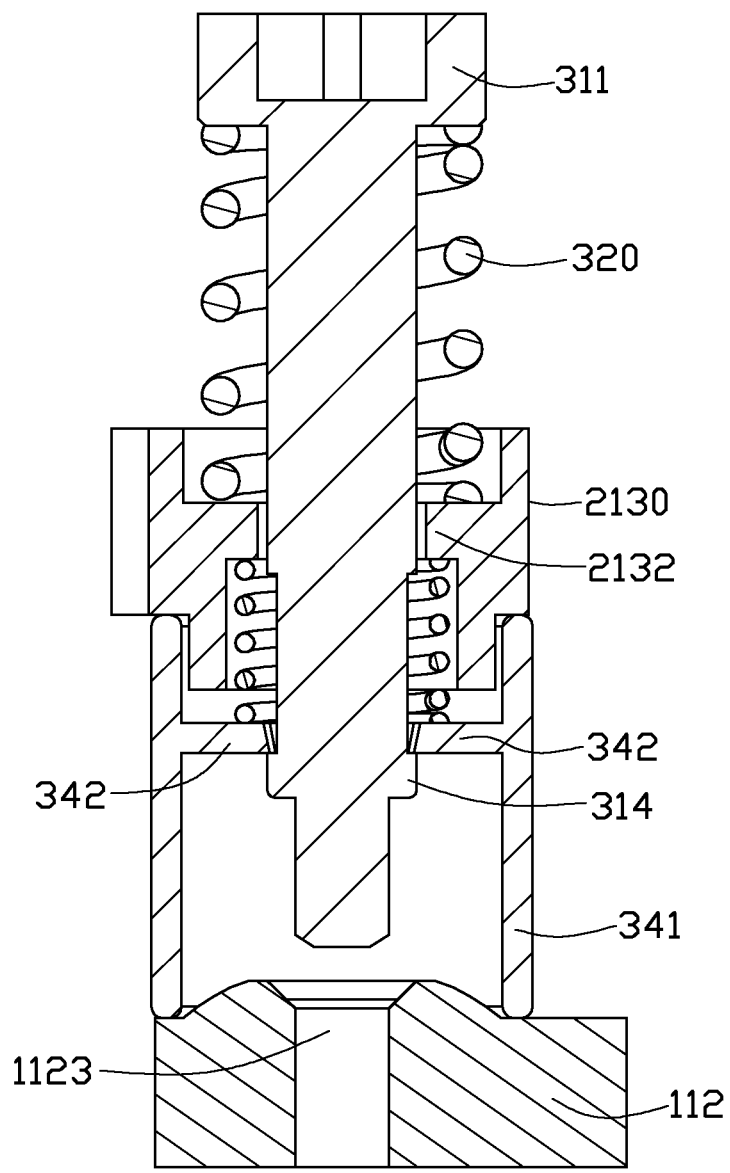
FIG. 5 is a cross-sectional view of the first fastener of FIG. 4 when assembled, showing the first fastener ready to be engaged with a supporting board of a heat sink of the heat dissipation device.
Figure 6:
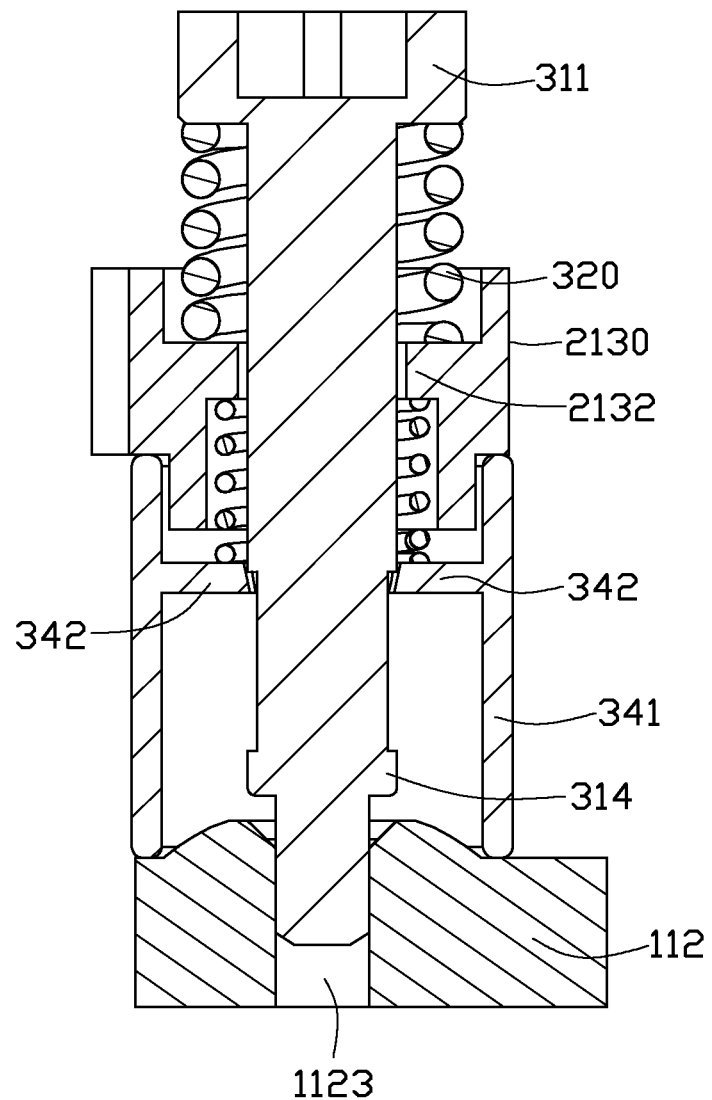
FIG. 6 is similar to FIG. 5, but showing the first fastener being engaged with the supporting board.

Referring also to FIGS. 4-6, each of the first fasteners 300 comprises a screwing pole 310, a first elastic member 320 and a second elastic member 330 encircling the screwing pole 310, and a fastening cylinder 340 engaging with the screwing pole 310. The screwing pole 310 comprises a head 311, a shaft 312 extending coaxially downwardly from the head 311, and a post 313 extending coaxially downwardly from the shaft 312. A cruciform groove (not labeled) is defined in a top face of the head 311, and is adapted for facilitating a tool to operate the first fastener 300. The shaft 312 has a cylindrical configuration. A diameter of the shaft 312 is smaller than that of the head 311, and larger than that of the post 313. The first elastic member 320 and the second elastic member 330 are both coil springs. The first elastic member 320 encircles the shaft 312, and the second elastic member 330 encircles the post 313. An annular protrusion 314 protrudes outwardly from an outer circumference of the post 313. The protrusion 314 is located at a middle of the post 313. The second elastic member 330 is located between the shaft 312 and the protrusion 314. The fastening cylinder 340 comprises a tube 341, and an annular collar 342 protruding inwardly from an inner circumference of the tube 341. In this embodiment, the annular collar 342 comprises a plurality of elastically deformable protrusions, which are equally angularly spaced from each other around the inner circumference of the tube 341, and which extend radially inward towards a center of the tube 341. Inmost edges of the protrusions are arranged along a circle, and define an inner diameter of the collar 342. The inner diameter of the collar 342 is a little smaller than a diameter of the protrusion 314.

Referring to FIGS. 1-6, in assembly of the heat dissipation device, for each first fastener 300, the screwing pole 310 firstly extends through the corresponding fixing cylinder 2130 of the fan 200 along a top to bottom direction. The first elastic member 320 is compressed between the head 311 and the baffle wall 2132. Then the second elastic member 330 encircles the post 313 of the screwing pole 310. The post 313 moves downwardly and extends through the fastening cylinder 340 along the top to bottom direction, until the protrusion 314 abuts against a bottom of the collar 342, as indicated in FIG. 5. In this position, the second elastic member 330 is compressed between the baffle wall 2132 of the fan 200 and the collar 342 of the fastening cylinder 340. A downward pressure is exerted on the first fastener 300 by, e.g., a human operator, to make the post 313 extend towards the supporting board 112 and screw into the corresponding first engaging hole 1123. Thereby, the fan 200 and the heat sink 100 are finally secured together by the two first fasteners 300.

However, in the embodiment of the present disclosure, if the fan 200 is first secured to the heat sink 100 by the two first fasteners 300 before the second fasteners 140 are extended through the second engaging holes 1124 and screwed into the printed circuit board, two corresponding second engaging holes 1124 are covered by the fan 200. This would mean that after the fan 200 is secured to the heat sink 100 by the two first fasteners 300, the two corresponding second fasteners 140 could not be extended through the two covered second engaging holes 1124 and screwed into the printed circuit board.

Thus during the assembly of the heat dissipation device, firstly, the fan 200 is secured to the heat sink 100 by only one first fastener 300, in the manner described above. That is, the first fastener 300 is extended through one fixing cylinder 2130 and screwed into one first engaging hole 1123. Then the fan 200 is rotated with respect to the first fastener 300, to cause the two second engaging holes 1124 originally covered by the fan 200 to be exposed. Next, the two corresponding second fasteners 140 are extended through the two second engaging holes 1124, respectively, and screwed into the printed circuit board. Then the fan 200 is rotated back with respect to the first fastener 300, until the other fixing cylinder 2130 aligns with the other first engaging hole 1123. The other first fastener 300 is fixed on the heat sink 100 and the fan 200, wherein the other first fastener 300 is extended through the other fixing cylinder 2130 and screwed into the other first engaging hole 1123. Finally, the remaining two second fasteners 140 are extended through two corresponding second engaging holes 1124 of the supporting board 112, respectively, and screwed into the printed circuit board. Thereby, the fan 200 and the heat sink 100 of the heat dissipation device are fixed to and in tight contact with the electronic component mounted on the printed circuit board.

It is to be understood, however, that even though numerous characteristics and advantages of various embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device comprising:
a fan comprising a plurality of fixing cylinders;
a heat sink comprising a supporting board; and
a plurality of first fasteners fixing the fan to the heat sink, each of the first fasteners comprising a screwing pole, a first elastic member and a second elastic member encircling the screwing pole, and a fastening cylinder engaging with the screwing pole;
wherein the screwing pole comprises a head, a shaft extending coaxially downwardly from the head, and a post extending coaxially downwardly from the shaft;
wherein for each of the first fasteners, the screwing pole extends through a corresponding fixing cylinder of the fan, the first elastic member is compressed between the head and the corresponding fixing cylinder, the second elastic member is compressed between the corresponding fixing cylinder and the fastening cylinder, and the post protrudes down from the fastening cylinder and is engaged with the supporting board;

wherein a baffle wall protrudes inwardly from an inner circumference of each fixing cylinder;

wherein the first elastic member is compressed between the head and the baffle wall of the corresponding fixing cylinder;

wherein the fastening cylinder comprises a tube and a collar protruding inwardly from an inner circumference of the tube; and wherein the second elastic member is compressed between the baffle wall of the corresponding fixing cylinder and the collar of the fastening cylinder.

2. The heat dissipation device of claim 1, wherein the screwing pole further comprises a protrusion protruding outwardly from an outer circumference of the post.

3. The heat dissipation device of claim 2, wherein a diameter of the protrusion is larger than an inner diameter of the collar of the fastening cylinder.

4. The heat dissipation device of claim 1, wherein a diameter of the shaft is smaller than that of the head, and larger than that of the post.

5. The heat dissipation device of claim 1, wherein the heat sink further comprises a plurality of second fasteners extended through the supporting board, the second fasteners adapted to be screwed into a circuit board.

6. The heat dissipation device of claim 1, wherein the heat sink further comprises a base engaging with the supporting board, a fin set disposed on the supporting board, and a plurality of heat pipes thermally connecting the base, the supporting board and the fin set.

7. The heat dissipation device of claim 6, wherein each of the heat pipes comprises an evaporation section, a condensation section, and a connecting section interconnecting the evaporation section and the condensation section.

8. The heat dissipation device of claim 7, wherein the evaporation section of each heat pipe is sandwiched between the base and the supporting board.

9. The heat dissipation device of claim 8, wherein the condensation section of each heat pipe extends through the fin set.

10. The heat dissipation device of claim 6, wherein the supporting board of the heat sink comprises a main body and a fin set holder at a side of the main body, the fin set being mounted on the fin set holder and defining a plurality of air passages, and the fan being positioned such that an airflow path of airflow generated by the fan is in fluid communication with the air passages of the fin set.

11. The heat dissipation device of claim 10, wherein the fan has an airflow outlet located adjacent to the fin set.

12. The heat dissipation device of claim 6, wherein the fan comprises a housing located over the supporting board and an impeller rotatably disposed in the housing.

13. The heat dissipation device of claim 1, wherein the first and second elastic members are coil springs.

14. A heat dissipation device comprising:
a fan comprising a plurality of fixing cylinders;
a heat sink comprising a supporting board; and
a plurality of first fasteners fixing the fan to the heat sink, each of the first fasteners comprising a screwing pole, a first elastic member and a second elastic member encircling the screwing pole, and a fastening cylinder engaging with the screwing pole;

wherein the screwing pole comprises a head, a shaft extending coaxially downwardly from the head, and a post extending coaxially downwardly from the shaft;

wherein for each of the first fasteners, the screwing pole extends through a corresponding fixing cylinder of the fan, the first elastic member is compressed between the head and the corresponding fixing cylinder, the second elastic member is compressed between the corresponding fixing cylinder and the fastening cylinder, and the post protrudes down from the fastening cylinder and is engaged with the supporting board;

wherein a baffle wall protrudes inwardly from an inner circumference of each fixing cylinder;

wherein the fastening cylinder comprises a tube and a collar protruding inwardly from an inner circumference of the tube; and wherein the second elastic member is compressed between the baffle wall of the corresponding fixing cylinder and the collar of the fastening cylinder.

\* \* \* \* \*